(12) United States Patent
Li

(10) Patent No.: US 11,232,723 B2
(45) Date of Patent: Jan. 25, 2022

(54) FOLDING DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Wenqi Li, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/981,284

(22) PCT Filed: Apr. 1, 2020

(86) PCT No.: PCT/CN2020/082741
§ 371 (c)(1),
(2) Date: Sep. 16, 2020

(87) PCT Pub. No.: WO2021/120443
PCT Pub. Date: Jun. 24, 2021

(65) Prior Publication Data
US 2021/0248932 A1    Aug. 12, 2021

(51) Int. Cl.
*H05K 1/18*    (2006.01)
*G09F 9/30*    (2006.01)

(52) U.S. Cl.
CPC ............. *G09F 9/301* (2013.01); *H05K 1/189* (2013.01); *H05K 2201/10128* (2013.01)

(58) Field of Classification Search
CPC .......... H05K 1/189; H05K 2201/10128; G09F 9/301; G06F 1/1652
USPC ....................................................... 361/679.27
See application file for complete search history.

(56) References Cited

U.S. PATENT DOCUMENTS

| 10,520,978 | B1 | 12/2019 | Li et al. |
| 2014/0375530 | A1 | 12/2014 | Delaporte |
| 2015/0227248 | A1 | 8/2015 | Yamazaki et al. |
| 2017/0038794 | A1 | 2/2017 | Song et al. |
| 2017/0117342 | A1 | 4/2017 | Kwon |

(Continued)

FOREIGN PATENT DOCUMENTS

| CN | 102789762 A | 11/2012 |
| CN | 103198803 A | 7/2013 |

(Continued)

*Primary Examiner* — Sherman Ng

(57) ABSTRACT

An embodiment of the present invention provides a folding display panel and a display device. The folding display panel has a first side and a second side opposite to each other, and a third side and a fourth side opposite to each other, the first side and the second side are perpendicular to the third side and the fourth side, and are connected to the third side and the fourth side. The display screen can fold into at least two horizontal display surfaces along a horizontal folding pivot shaft parallel to the first side and the second side, or can fold into at least two vertical display surfaces along a vertical folding pivot shaft perpendicular to the first side and the second side. The present invention sets forth configuration and application of a perpendicularly intersecting screen.

16 Claims, 19 Drawing Sheets

(56) References Cited

U.S. PATENT DOCUMENTS

| | | |
|---|---|---|
| 2018/0018914 A1 | 1/2018 | Ikeda et al. |
| 2018/0120997 A1 | 5/2018 | Moon et al. |
| 2018/0218663 A1 | 8/2018 | Guo et al. |
| 2019/0140198 A1 | 5/2019 | Li |
| 2019/0227600 A1 | 7/2019 | Hirakata et al. |
| 2019/0281692 A1 | 9/2019 | Jeon |
| 2020/0135832 A1 | 4/2020 | Ma et al. |
| 2020/0152109 A1* | 5/2020 | Jung ................... G09G 3/3648 |
| 2020/0194724 A1* | 6/2020 | Ahn ................... H01L 51/5246 |
| 2020/0292872 A1 | 9/2020 | Hirakata |

FOREIGN PATENT DOCUMENTS

| | | |
|---|---|---|
| CN | 203760055 U | 8/2014 |
| CN | 104867406 A | 8/2015 |
| CN | 105139818 A | 12/2015 |
| CN | 105408950 A | 3/2016 |
| CN | 105452981 A | 3/2016 |
| CN | 105493169 A | 4/2016 |
| CN | 106790811 A | 5/2017 |
| CN | 106935171 A | 7/2017 |
| CN | 107945663 A | 4/2018 |
| CN | 108022958 A | 5/2018 |
| CN | 108681176 A | 10/2018 |
| CN | 108766249 A | 11/2018 |
| CN | 109410761 A | 3/2019 |

\* cited by examiner

FOLDING DISPLAY PANEL AND DISPLAY DEVICE

RELATED APPLICATIONS

This application is a Notional Phase of PCT Patent Application No. PCT/CN2020/082741 having international filing date of Apr. 1, 2020, which claims the benefit of priority of Chinese Patent Application No. 201911316234.6 filed on Dec. 19, 2019. The contents of the above applications are all incorporated by reference as if fully set forth herein in their entirety.

FIELD OF INVENTION

The present invention relates to a field of display technologies, specifically relates to a folding display panel and a display device.

BACKGROUND OF INVENTION

With advent of new dynamic foldable display screens, many semiconductor display and terminal companies have launched various concept prototypes with folding display regions. Single folding concept protypes are the most, and double folding concept products has been lunched a lot. Because of common designs of the display panel and the driver circuit, the driver chip is located on a lower frame. Folding of the display region of the display panel cannot affect the integrate circuit, in other words, it cannot fold along a direction folding the driver chip. Therefore, the current folding screens, both the single folding screen and the multi-folding screen, fold along a single direction.

SUMMARY OF INVENTION

Technical Issue

An embodiment of the present invention provides a folding display panel and a display device to change the single folding configuration of the folding screen.

Technical Solution

The present invention provides a folding display panel comprising a display screen, wherein the display screen comprises a first side and a second side that are opposite to each other, and a third side and a fourth side that are opposite to each other, the first side and the second side are perpendicular to the third side and the fourth side, and are connected to the third side and the fourth side, the display screen is capable of folding into at least two horizontal display surfaces along a horizontal folding pivot shaft parallel to the first side and the second side, and the display screen is capable of folding into at least two vertical display surfaces along a vertical folding pivot shaft perpendicular to the first side and the second side.

In some embodiments, the folding display panel further comprises a driver chip, data lines, and a circuit board, the driver chip is connected to one of the first, second, third, and fourth sides of the display screen through the data lines, and the circuit board is disposed on a side of the driver chip away from the display screen.

In some embodiments, the driver chip comprises a first driver chip an a second driver chip, the first driver chip and the second driver chip are disposed on two sides of the vertical folding pivot shaft extension line respectively, and are connected to the first side through the data lines respectively; the circuit board comprises a first circuit board and a second circuit board, the first circuit board is connected to the first driver chip and is located on a side away from the first side, the second circuit board is connected to the second driver chip and is located on the side away from the first side, and the first circuit board are connected to the second circuit board through an adapter flexible circuit board.

In some embodiments, the driver chip comprises a first driver chip and a second driver chip, the first driver chip and the second driver chip are disposed on a side of the vertical folding pivot shaft extension line and are connected to the first side through the data lines respectively; the circuit board is connected to the first driver chip and the second driver chip and is located on a side away from the first side.

In some embodiments, the circuit board comprises a first circuit board and a second circuit board, the first circuit board is connected to the first driver chip and is located on the side away from the first side, the second circuit board is connected to the second driver chip and is located on a side away from the first side, and the first circuit board is connected to the second circuit board through an adapter flexible circuit board.

In some embodiments, the horizontal folding pivot shaft comprises a first horizontal folding pivot shaft and a second horizontal folding pivot shaft, the driver chip comprises a first driver chip, a second driver chip , and a third driver chip, the first driver chip, the second driver chip, and the third driver chip are connected to the third side through the data lines respectively, the first driver chip and the second driver chip are located on two sides of the first horizontal folding pivot shaft respectively, the second driver chip and the third driver chip are located on two sides of the second horizontal folding pivot shaft, and the first driver chip, the second driver chip, and the third driver chip are connected to one another through flexible data lines.

In some embodiments, the circuit board comprises a first circuit board, a second circuit board, and a third circuit board, the first circuit board is connected to the first driver chip and is located on a side away from the third side, the second circuit board is connected to the second driver chip and is located on the side away from the third side, the third circuit board is connected to the third driver chip and is located on the side away from the third side, the first circuit board, the second circuit board, and the third circuit board are connected to one another through an adapter flexible circuit board, and the second circuit board is connected to a mainboard through the data lines.

In some embodiments, a matching circuit is disposed between the driver chip and the display screen, and the matching circuit is configured to match an impedance of each of the data lines.

In some embodiments, the circuit board comprises a flexible circuit board and a rigid circuit board, the flexible circuit board is disposed on a side of the driver chip away from the display screen, the rigid circuit board is disposed on a side of the flexible circuit board away from the driver chip, a timing control chip is disposed on the rigid circuit board, and the timing control chip is configured to match an impedance of each of the data lines by adjusting a delay time of a data signal.

In some embodiments, the folding display panel further comprises a timing control chip and a circuit board; the circuit board comprises a flexible circuit board, an adapter flexible circuit board, and a mainboard; the flexible circuit board comprises a first flexible circuit board, a second flexible circuit board, and a third flexible circuit board, the first flexible circuit board, the second flexible circuit board, and the third flexible circuit board are disposed on the vertical folding pivot shaft, the horizontal folding pivot shaft comprises a first horizontal folding pivot shaft and a second horizontal folding pivot shaft, the first flexible circuit board and second flexible circuit board are located on two sides of the first horizontal folding pivot shaft respectively, the second flexible circuit board and the third flexible circuit board are disposed on two sides of the second horizontal folding pivot shaft respectively; the mainboard is disposed between the first horizontal folding pivot shaft and the second horizontal folding pivot shaft and is connected to the flexible circuit board through the adapter flexible circuit board; and the timing control chip is disposed on the mainboard.

The present invention provides a display device comprising a folding display panel, wherein the folding display panel comprises a display screen, the display screen comprises a first side and a second side that are opposite to each other, and a third side and a fourth side that are opposite to each other, the first side and the second side are perpendicular to the third side and the fourth side, and are connected to the third side and the fourth side, the display screen is capable of folding into at least two horizontal display surfaces along a horizontal folding pivot shaft parallel to the first side and the second side, and the display screen is capable of folding into at least two vertical display surfaces along a vertical folding pivot shaft perpendicular to the first side and the second side.

In some embodiments, the folding display panel further comprises a driver chip, data lines, and a circuit board, the driver chip is connected to one of the first, second, third, and fourth sides of the display screen through the data lines, and the circuit board is disposed on a side of the driver chip away from the display screen.

In some embodiments, the driver chip comprises a first driver chip an a second driver chip, the first driver chip and the second driver chip are disposed on two sides of the vertical folding pivot shaft extension line respectively, and are connected to the first side through the data lines respectively; the circuit board comprises a first circuit board and a second circuit board, the first circuit board is connected to the first driver chip and is located on a side away from the first side, the second circuit board is connected to the second driver chip and is located on the side away from the first side, and the first circuit board are connected to the second circuit board through an adapter flexible circuit board.

In some embodiments, the driver chip comprises a first driver chip and a second driver chip, the first driver chip and the second driver chip are disposed on a side of the vertical folding pivot shaft extension line and are connected to the first side through the data lines respectively; the circuit board is connected to the first driver chip and the second driver chip and is located on a side away from the first side.

In some embodiments, the circuit board comprises a first circuit board and a second circuit board, the first circuit board is connected to the first driver chip and is located on the side away from the first side, the second circuit board is connected to the second driver chip and is located on a side away from the first side, and the first circuit board is connected to the second circuit board through an adapter flexible circuit board.

In some embodiments, the horizontal folding pivot shaft comprises a first horizontal folding pivot shaft and a second horizontal folding pivot shaft, the driver chip comprises a first driver chip, a second driver chip , and a third driver chip, the first driver chip, the second driver chip, and the third driver chip are connected to the third side through the data lines respectively, the first driver chip and the second driver chip are located on two sides of the first horizontal folding pivot shaft respectively, the second driver chip and the third driver chip are located on two sides of the second horizontal folding pivot shaft, and the first driver chip, the second driver chip, and the third driver chip are connected to one another through flexible data lines.

In some embodiments, the circuit board comprises a first circuit board, a second circuit board, and a third circuit board, the first circuit board is connected to the first driver chip and is located on a side away from the third side, the second circuit board is connected to the second driver chip and is located on the side away from the third side, the third circuit board is connected to the third driver chip and is located on the side away from the third side, the first circuit board, the second circuit board, and the third circuit board are connected to one another through an adapter flexible circuit board, and the second circuit board is connected to a mainboard through the data lines.

In some embodiments, a matching circuit is disposed between the driver chip and the display screen, and the matching circuit is configured to match an impedance of each of the data lines.

In some embodiments, the circuit board comprises a flexible circuit board and a rigid circuit board, the flexible circuit board is disposed on a side of the driver chip away from the display screen, the rigid circuit board is disposed on a side of the flexible circuit board away from the driver chip, a timing control chip is disposed on the rigid circuit board, and the timing control chip is configured to match an impedance of each of the data lines by adjusting a delay time of a data signal.

In some embodiments, the folding display panel further comprises a timing control chip and a circuit board; the circuit board comprises a flexible circuit board, an adapter flexible circuit board, and a mainboard; the flexible circuit board comprises a first flexible circuit board, a second flexible circuit board, and a third flexible circuit board, the first flexible circuit board, the second flexible circuit board, and the third flexible circuit board are disposed on the vertical folding pivot shaft, the horizontal folding pivot shaft comprises a first horizontal folding pivot shaft and a second horizontal folding pivot shaft, the first flexible circuit board and second flexible circuit board are located on two sides of the first horizontal folding pivot shaft respectively, the second flexible circuit board and the third flexible circuit board are disposed on two sides of the second horizontal folding pivot shaft respectively; the mainboard is disposed between the first horizontal folding pivot shaft and the second horizontal folding pivot shaft and is connected to the flexible circuit board through the adapter flexible circuit board; and the timing control chip is disposed on the mainboard.

Advantages

The folding display panel provided by an embodiment of the present invention comprises a display screen, the display screen comprises a first side and a second side that are opposite to each other, and a third side and a fourth side that are opposite to each other, the first side and the second side are perpendicular to the third side and the fourth side, and are connected to the third side and the fourth side, the display screen is capable of folding into at least two horizontal display surfaces along a horizontal folding pivot shaft parallel to the first side and the second side, and the display screen is capable of folding into at least two vertical display surfaces along a vertical folding pivot shaft perpendicular to the first side and the second side. The folding display panel changes the single folding configuration of the folding screen and sets forth configuration and application of a perpendicularly intersecting screen.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
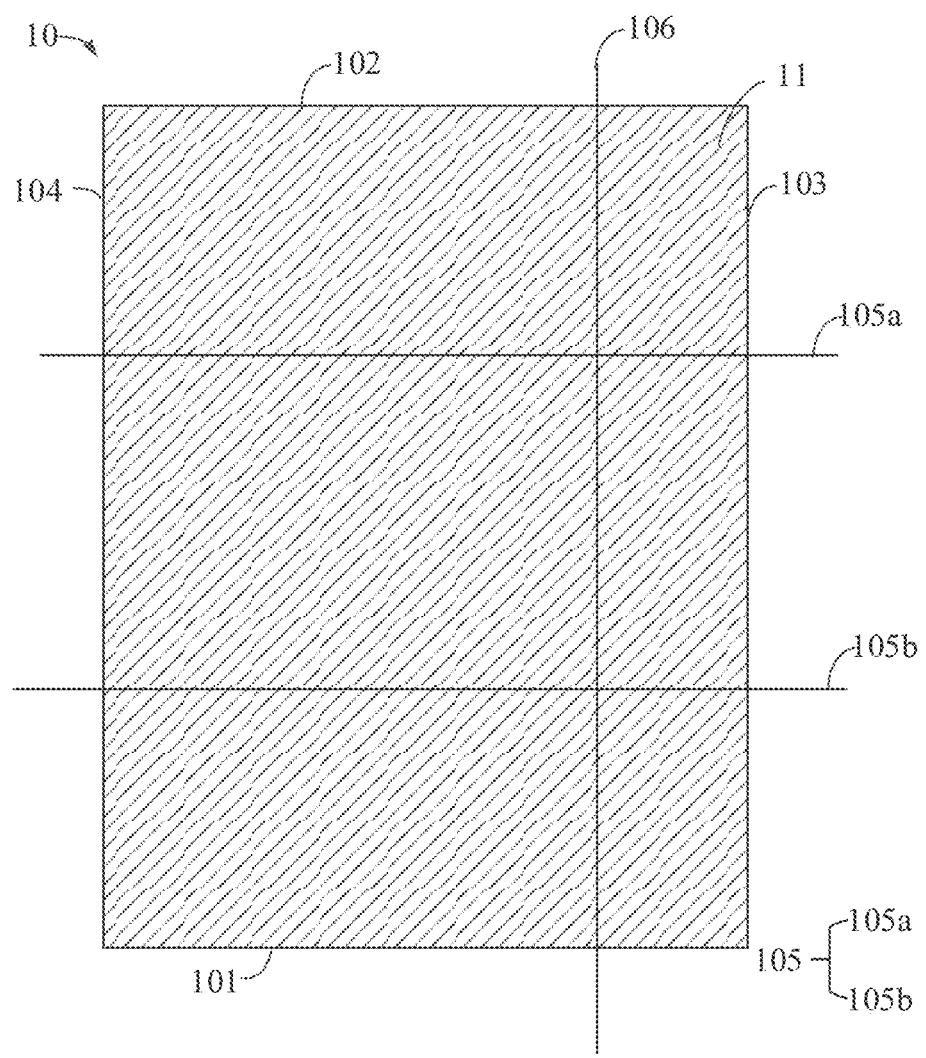
FIG. 1 is a first schematic structural view of a folding display panel of an embodiment of the present invention.

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

It should be explained that in the description of the present invention, it is to be understood that orientation or positional relationships indicated by terms "upper", "lower", "front", "rear", "left", "right", "inside", "outside", etc., are based on the orientation or positional relationship shown in the drawings, and are merely for convenience of describing the present invention and simplifying the description, rather than indicating or implying that the device or component must have a specific orientation and be configured and operated in a specific orientation, and therefore they cannot be understood as limitations to the present invention.

An embodiment of the present invention provides a folding display panel, and the folding display panel will be introduced in detail as follows.

With reference to FIG. 1, FIG. 1 is a first schematic structural view of a folding display panel 10 of an embodiment of the present invention. The folding display panel 10 comprises a display screen 11, the display screen 11 comprises a first side 101 and a second side 102 that are disposed opposite to each other, and a third side 103 and a fourth side 104 that are disposed opposite to each other. The first side 101 and the second side 102 are perpendicular to the third side 103 and the fourth side 104, and are connected to the third side 103 and the fourth side 104. The display screen 11 is capable of folding into at least two horizontal display surfaces along a horizontal folding pivot shaft 105 parallel to the first side 101 and the second side 102, and the display screen 11 is also capable of folding into at least two vertical display surfaces along a vertical folding pivot shaft 106 perpendicular to the first side 101 and the second side 102. The folding display panel 10 of the embodiment of the present invention sets forth the perpendicularly intersecting configuration of the folding display panel 10 to change the single folding configuration of the folding display panel 10.

It should be explained that in description of the present invention, the first side 101, the second side 102, the third side 103, and the fourth side 104 can be an upper side, a lower side, a left side and a right side of the display screen 11, and are merely for convenience of describing the present invention and simplifying the description, rather than indicating or implying that the device or component must have a specific orientation and be configured and operated in a specific orientation, and therefore they cannot be understood as limitations to the present invention.

The display screen 11 is capable of folding into two, three or more horizontal display surfaces along the horizontal folding pivot shaft 105, and the display screen 11 can fold into two, three or or more vertical display surfaces along the vertical folding pivot shaft 106.

Figure 2:
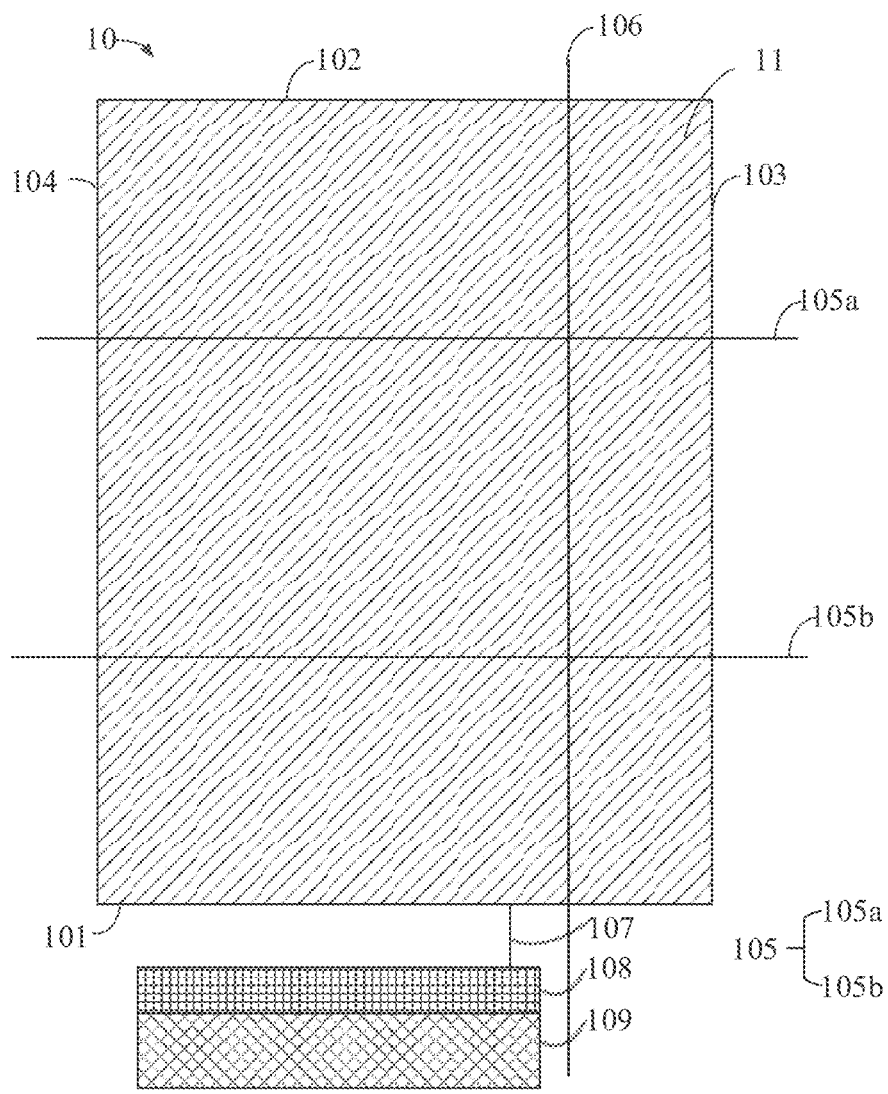
FIG. 2 is a second schematic structural view of the folding display panel of the embodiment of the present invention.

With reference to FIG. 2, FIG. 2 is a second schematic structural view of the folding display panel 10 of the embodiment of the present invention. The folding display panel 10 further comprises a driver chip 108, data lines 107, and a circuit board 109. The driver chip 108 is connected to one of the first side 101, the second side 102, the third side 103, and the fourth side 104 of the display screen 11 through the data lines 107. The circuit board 109 is disposed on a side of the driver chip 108 away from the display screen 11. Disposing the driver chip 108 can be configured to coordinate and deal with screen splitting of pixels of the display screen 11.

The driver chip 108 an be connected to the first side 101, the second side 102, the third side 103, or the fourth side 104 of the display screen 11.

Furthermore, the driver chip 108 is disposed to intersect the horizontal folding pivot shaft 105 and the vertical folding pivot shaft 106. In other words, driver chip 108 is not disposed on an extension line or an extension line of the vertical folding pivot shaft 106 to prevent the folding display screen 11 from affecting the driver chip 108.

Figure 3:
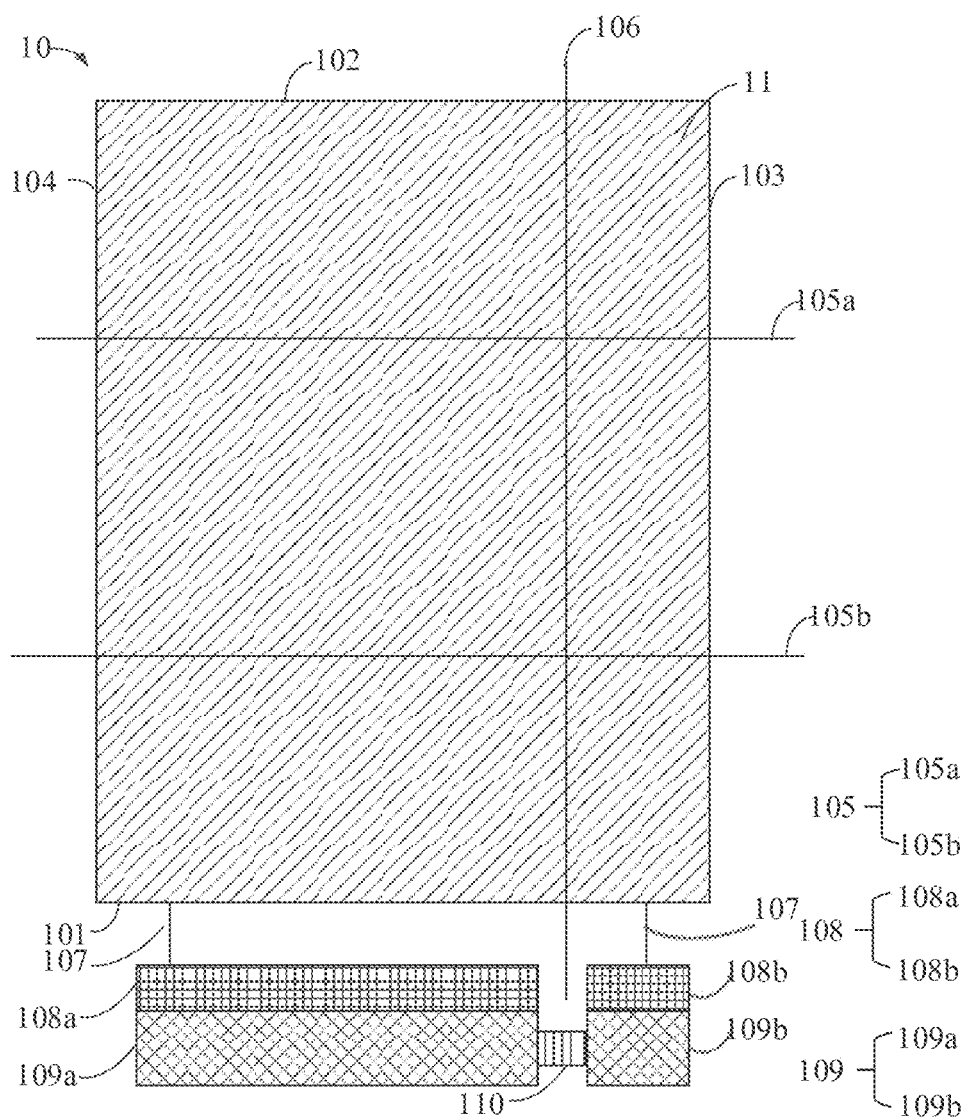
FIG. 3 is a third schematic structural view of the folding display panel of the embodiment of the present invention.

With reference to FIG. 3, FIG. 3 is a third schematic structural view of the folding display panel 10 of the embodiment of the present invention. In the embodiment of the present invention, a difference of the folding display panel 10 from the former embodiment is that the driver chip 108 comprises a first driver chip 108a and a second driver chip 108b. The first driver chip 108a and the second driver chip 108b are disposed on two sides of the extension line of the vertical folding pivot shaft 106 respectively, and are connected to the first side 101 through the data lines 107 respectively. The circuit board 109 comprises a first circuit board 109a and a second circuit board 109b. The first circuit board 109a is connected to the first driver chip 108a, and is located on a side away from the first side 101. The second circuit board 109b is connected to the second driver chip 108b, and is located on a side away from the first side 101. The first circuit board 109a is connected to the second circuit board 109b through an adapter flexible circuit board 110. Because the first driver chip 108a and the second driver chip 108b are disposed on the two sides of the extension line of the vertical folding pivot shaft 106 respectively, the folding display screen 11 prevents folding from affecting the circuit. A dual-chip driver framework can also support display requirement of a high resolution.

It should be explained that the driver chip 108 can be disposed on the first side 101 of the display screen 11. Of course, the driver chip 108 can also be disposed on the second side 102 of the display screen 11, difference between the first side 101 and the second side 102 is merely for convenience of describing the present invention and simplifying the description, rather than indicating or implying that the device or component must have a specific orientation and be configured and operated in a specific orientation, and therefore they cannot be understood as limitations to the present invention.

A matching circuit is disposed between the driver chip 108 and the display screen 11 and is configured to match an impedance of each of data lines 107. Specifically, the impedance can be increased by lengthening lengths of wires of the data lines 107 and decreasing widths of the wires, or the impedance can be decreased by shortening the lengths of the wires of the data lines 107 wires and increasing the width of the wires such that each of the wires of the data lines 107 has the same impedance. Furthermore, in a region with shorter ones of the wires, the data lines 107 are disposed with curved wires and the widths of the wires are decreased. Specifically, wires can be configured to be zigzag wires. In a region with longer ones of the wires, the data lines 107 are disposed with straight wires and the widths of the wires are increased. Of course, there are also other wire configurations, in the embodiment of the present invention no redundant description is made. By changing the wire configuration to match the impedance lowers the cost.

Figure 4:
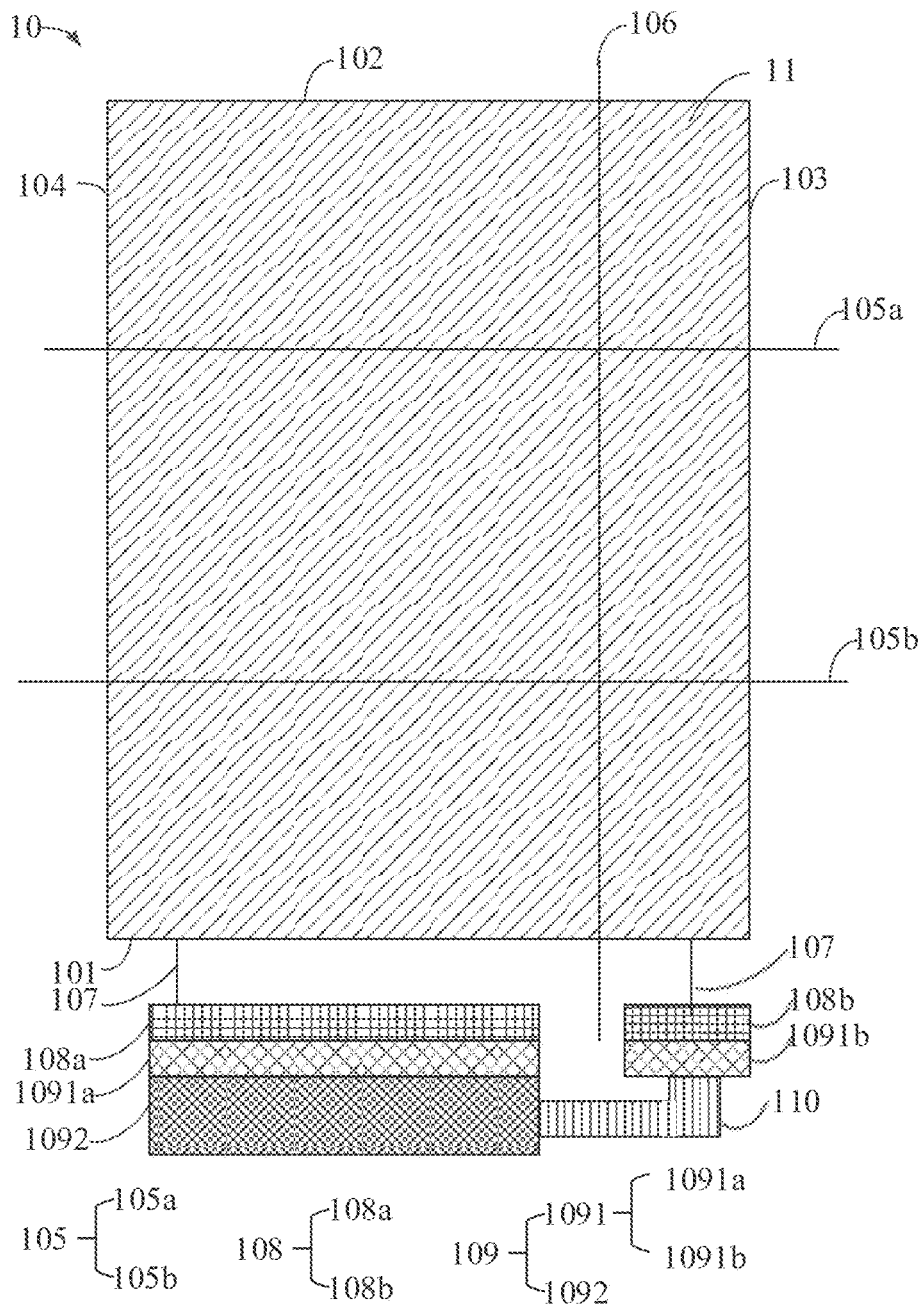
FIG. 4 is a fourth schematic structural view of the folding display panel of the embodiment of the present invention.

With reference to FIG. 4, the circuit board 109 comprises a flexible circuit board 1091 and a rigid circuit board 1092. The flexible circuit board 1091 is disposed on the side of the driver chip 108 away from the display screen 11, and the flexible circuit board 1091 comprises a first flexible circuit board 1091a and a second flexible circuit board 1091b. The rigid circuit board 1092 is disposed on a side of the flexible circuit board 1091 away from the driver chip 108, and the rigid circuit board 1092 are connected to the flexible circuit board 1091 through an adapter flexible circuit board 110. The flexible circuit board 1091 is disposed on the rigid circuit board 1092 such that the circuit board 109 can fold on the flexible circuit board 1091 to achieve an effect of reducing the screen bezel.

Figure 5:
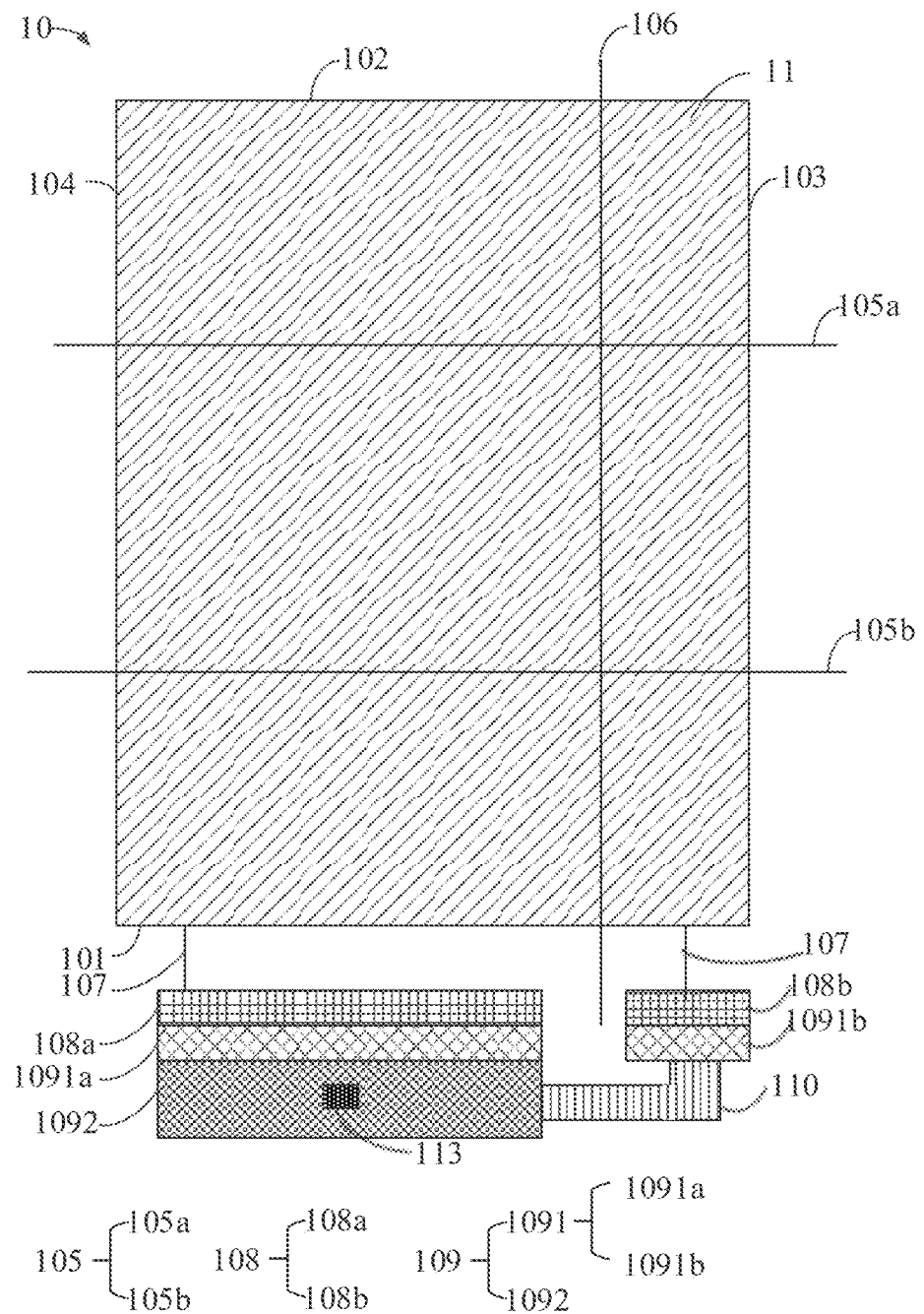
FIG. 5 is a fifth schematic structural view of the folding display panel of the embodiment of the present invention.

With reference to FIG. 5, a timing control chip 113 is disposed on the rigid circuit board 1092. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

The matching circuit and the timing control chip 113 are disposed in the folding display panel 10 to match the impedance.

Because the first driver chip 108a and the second driver chip 108b are disposed on two sides of the extension line of the vertical folding pivot shaft 106 respectively, the folding display screen 11 prevents folding from affecting the circuit. A dual-chip driver framework can also support display requirement of a high resolution. Furthermore, the matching circuit and the timing control chip 113 disposed to match the impedance can achieve the maximum use rate of power and prevent the folding display panel 10 from generating circuit issues. By changing the wire configuration to match the impedance lowers the cost.

Figure 6:
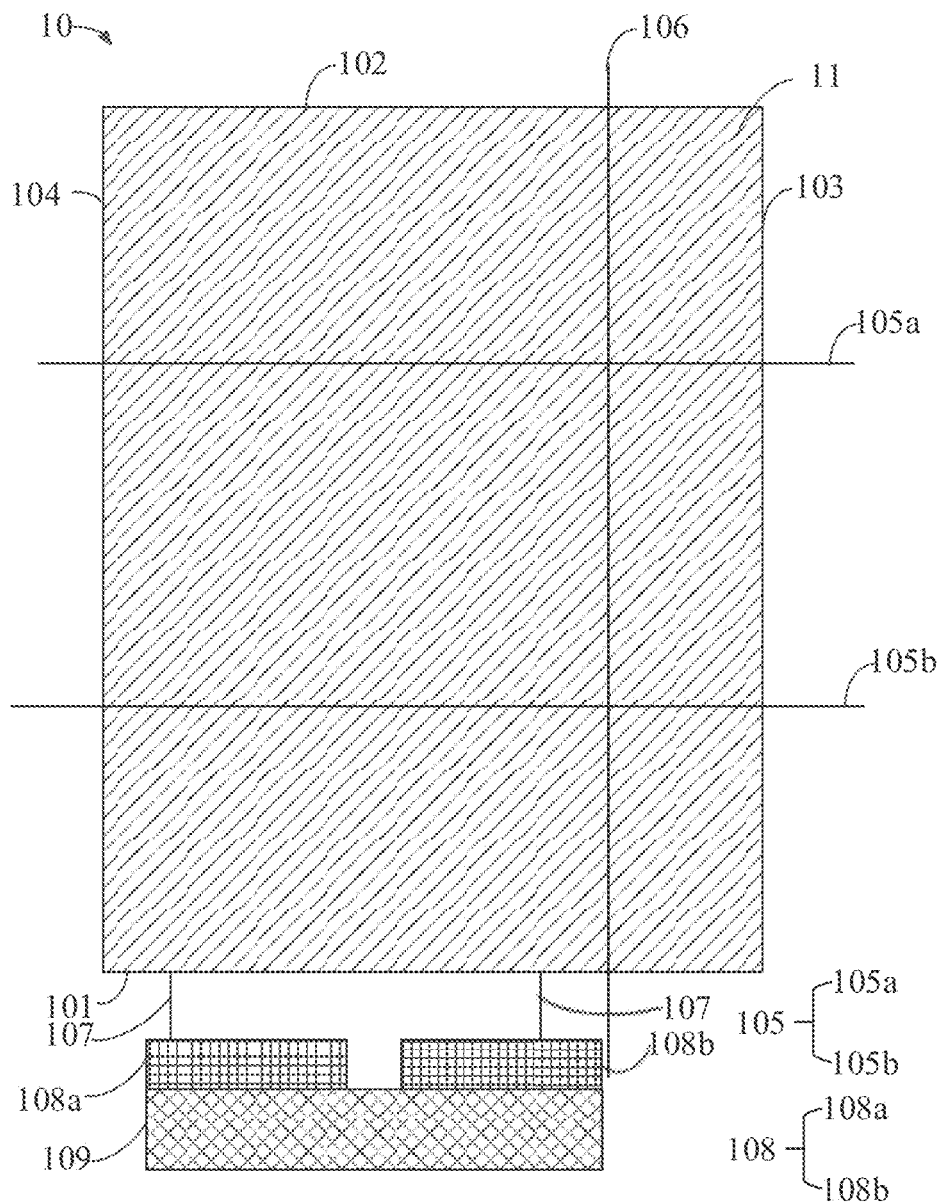
FIG. 6 is a sixth schematic structural view of the folding display panel of the embodiment of the present invention.

With reference to FIG. 6, FIG. 6 is a sixth schematic structural view of the folding display panel 10 of the embodiment of the present invention.

In the embodiment of the present invention, a difference of the folding display panel 10 from the former embodiment is that the driver chip 108 comprises a first driver chip 108a and a second driver chip 108b. The first driver chip 108a and the second driver chip 108b are disposed on the same side of the extension line of the vertical folding pivot shaft 106 and are connected to the first side 101 through the data lines 107 respectively. The circuit board 109 and the first driver chip 108a are connected to the second driver chip 108b and are located on a side away from the first side 101. Disposing the driver chip 108 on the same side of the vertical folding pivot shaft 106 can also prevent the folding screen from affecting the circuit. A dual-chip driver framework can also support display requirement of a high resolution.

Figure 7:
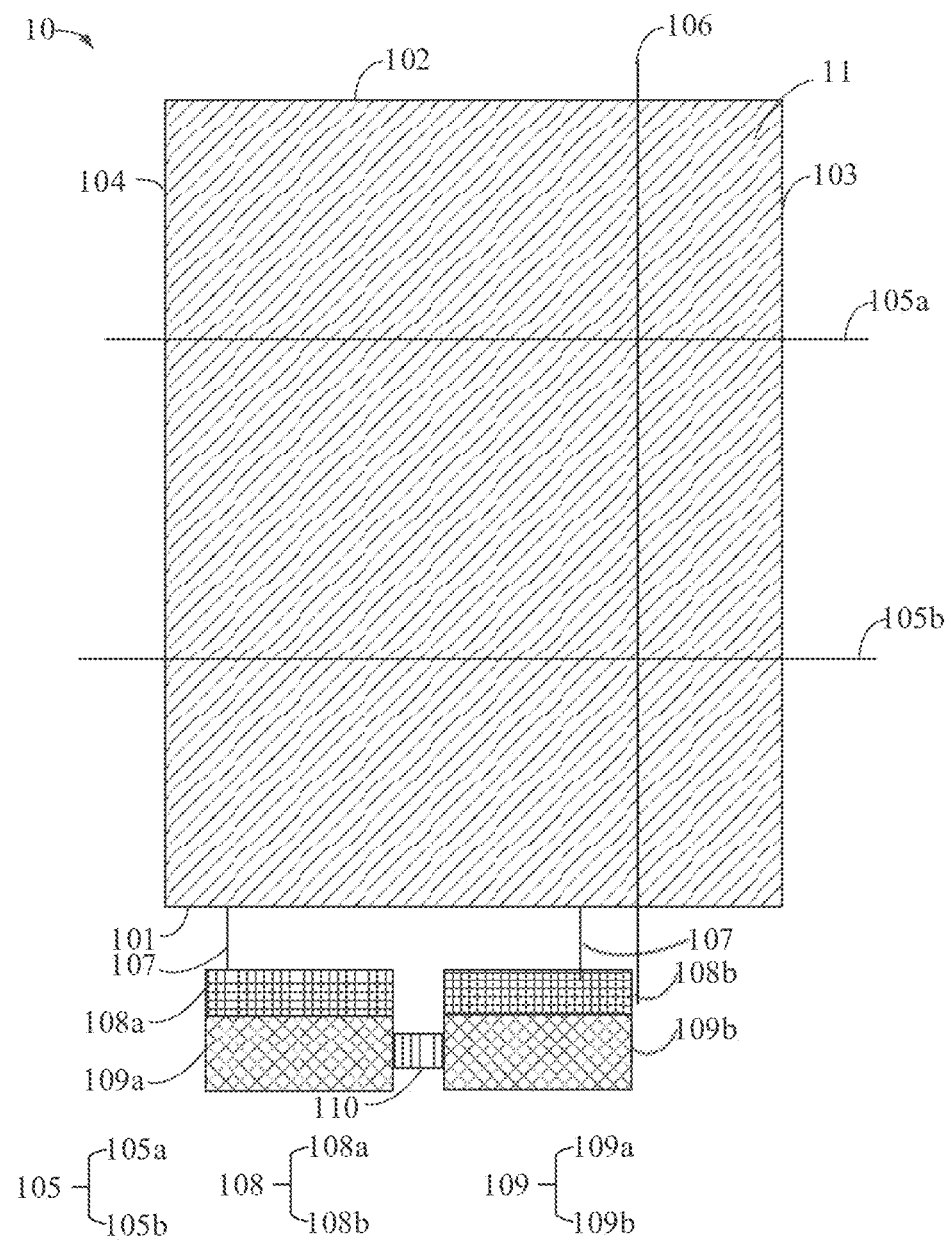
FIG. 7 is a seventh schematic structural view of the folding display panel of the embodiment of the present invention.

With reference to FIG. 7, the circuit board 109 can comprise a first circuit board 109a and a second circuit board 109b. The first circuit board 109a is connected to the first driver chip 108a and is located on the side away from the first side 101. The second circuit board 109b is connected to the second driver chip 108b and is located on the side away from the first side 101. The first circuit board 109a is connected to the second circuit board 109b through an adapter flexible circuit board 110.

Figure 8:
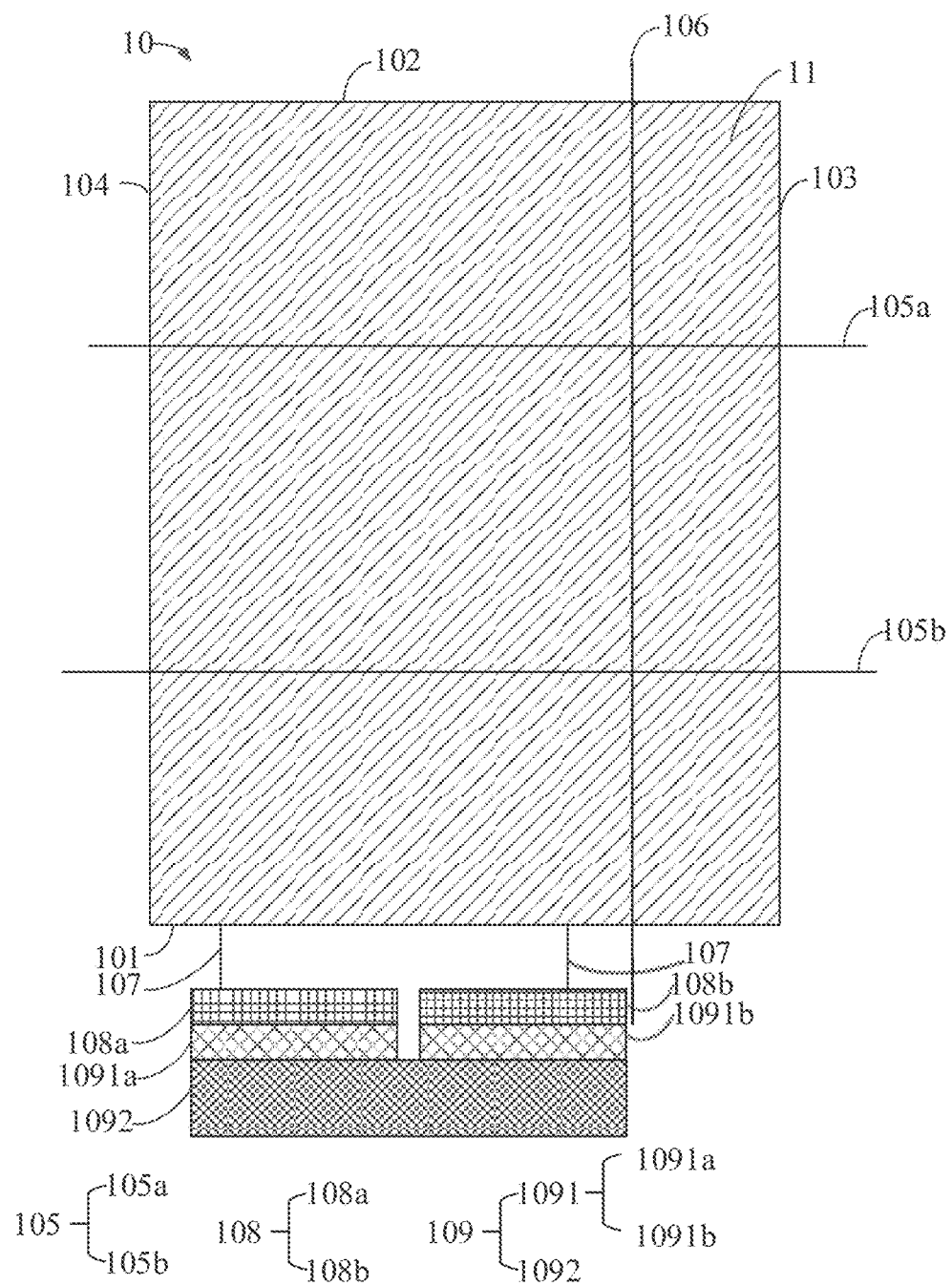
FIG. 8 is an eighth schematic structural view of the folding display panel of the embodiment of the present invention.

With reference to FIG. 8, the circuit board 109 comprises a flexible circuit board 1091 and a rigid circuit board 1092. The flexible circuit board 1091 is disposed on a side of the driver chip 108 away from the display screen 11. The flexible circuit board 1091 comprises a first flexible circuit board 1091a and a second flexible circuit board 1091b. The rigid circuit board 1092 is disposed on a side of the flexible circuit board 1091 away from the driver chip 108. The flexible circuit board 1091 is disposed on the rigid circuit board 1092 such that the circuit board can fold on the flexible circuit board 1091 to achieve an effect of reducing the screen bezel.

A matching circuit is disposed between the driver chip 108 and the display screen 11 and is configured to match an impedance of each of data lines 107. Specifically, the impedance can be increased by lengthening lengths of wires of the data lines 107 and decreasing widths of the wires, or the impedance can be decreased by shortening the lengths of the wires of the data lines 107 wires and increasing the width of the wires such that each of the wires of the data lines 107 has the same impedance. Furthermore, in a region with shorter ones of the wires, the data lines 107 are disposed with curved wires and the widths of the wires are decreased. Specifically, wires can be configured to be zigzag wires. In a region with longer ones of the wires, the data lines 107 are disposed with straight wires and the widths of the wires are increased. Of course, there are also other wire configurations, in the embodiment of the present invention no redundant description is made. By changing the wire configuration to match the impedance lowers the cost.

Figure 9:
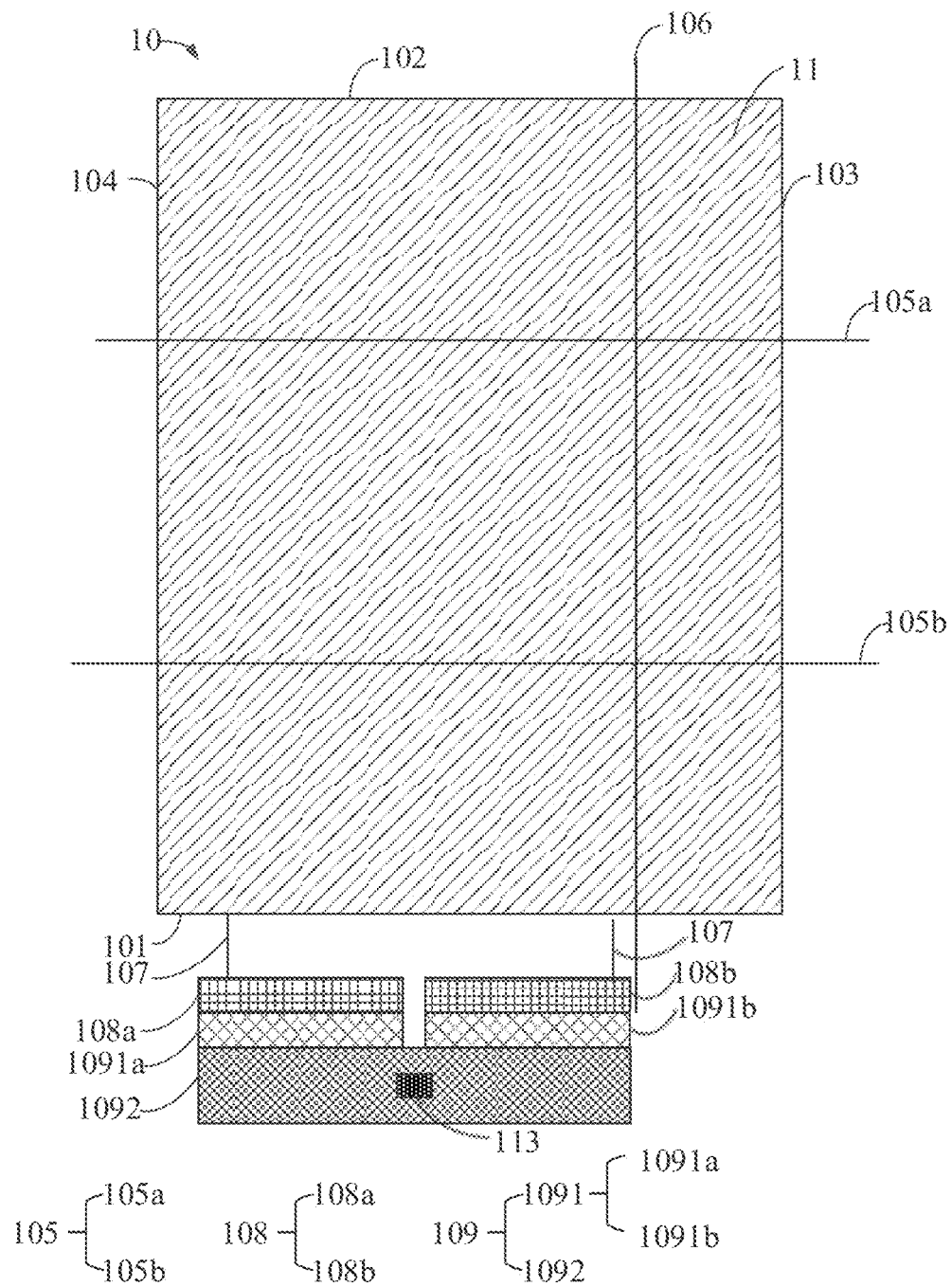
FIG. 9 is a ninth schematic structural view of the folding display panel of the embodiment of the present invention.

With reference to FIG. 9, a timing control chip 113 is disposed on the rigid circuit board 1092. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

The matching circuit and the timing control chip 113 are disposed in the folding display panel 10 to match the impedance.

Because the first driver chip 108a and the second driver chip 108b are disposed on the same side of the extension line of the vertical folding pivot shaft 106, the folding display screen 11 prevents folding from affecting the circuit. A dual-chip driver framework can also support display requirement of a high resolution. Furthermore, Furthermore, the matching circuit and the timing control chip 113 disposed to match the impedance can achieve the maximum use rate of power and prevent the folding display panel 10 from generating circuit issues. By changing the wire configuration to match the impedance lowers the cost.

Figure 10:
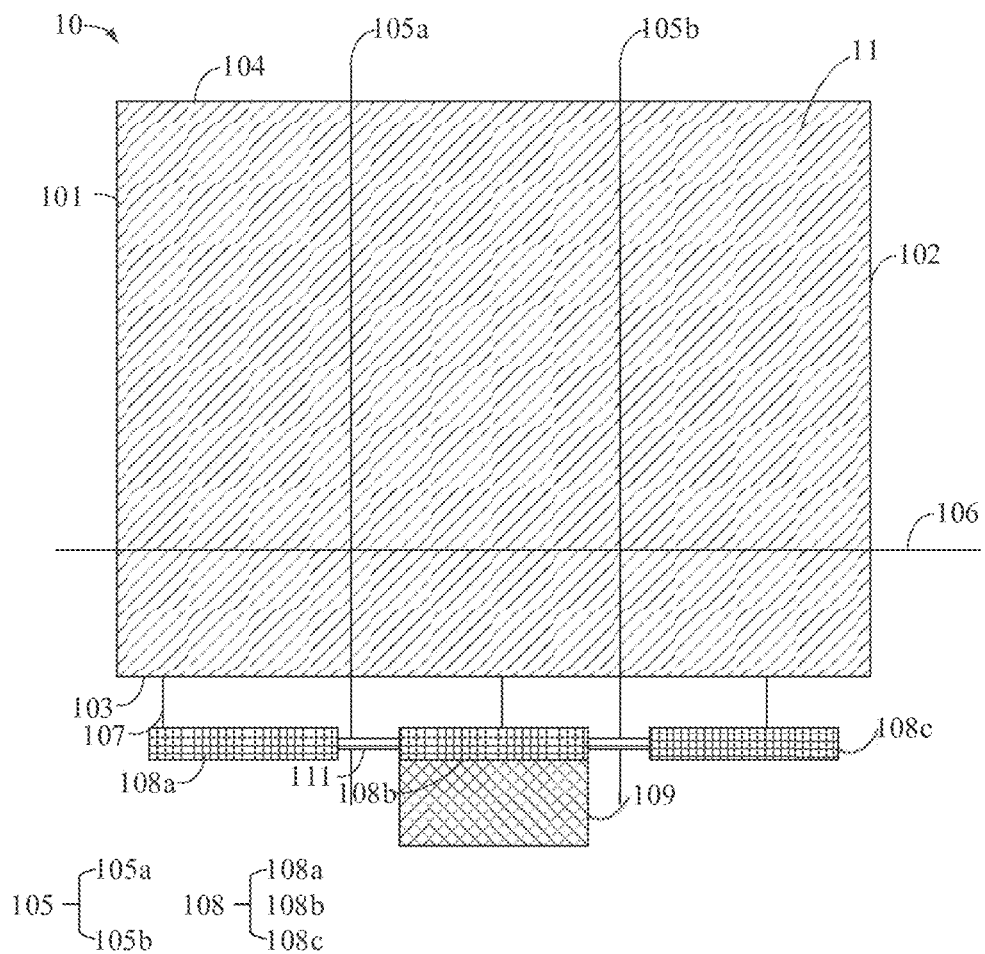
FIG. 10 is a tenth schematic structural view of the folding display panel of the embodiment of the present invention.

With reference to FIG. 10, FIG. 10 is a tenth schematic structural view of the folding display panel 10 of the embodiment of the present invention.

In the embodiment of the present invention, a difference of the folding display panel 10 from the former embodiment is that the horizontal folding pivot shaft 105 comprises a first horizontal folding pivot shaft 105a and a second horizontal folding pivot shaft 105b, the driver chip 108 comprises a first driver chip 108a, a second driver chip 108b and a third driver chip 108c. The first driver chip 108a, the second driver chip 108b, and the third driver chip 108c are connected to the third side 103 through the data lines 107 respectively. The first driver chip 108a and the second driver chip 108b are located two sides of the first horizontal folding pivot shaft 105a respectively. The second driver chip 108b and third driver chip 108c are located on two sides of the second horizontal folding pivot shaft 105b respectively. The first driver chip 108a, the second driver chip 108b, and the third driver chip 108c are connected to one another through flexible data lines 111.

It should be explained that the driver chip 108 can be disposed on the third side 103 of the display screen 11. Of course, the driver chip 108 can also be disposed on the fourth side 104 of the display screen 11. A difference between the third side 103 and the fourth side 104 is merely for convenience of describing the present invention and simplifying the description, rather than indicating or implying that the device or component must have a specific orientation and be configured and operated in a specific orientation, and therefore they cannot be understood as limitations to the present invention.

Because the flexible data lines 111 is disposed on the extension line of the folding pivot shaft of the folding display panel 10, to prevent the folding screen from affecting the circuit, a protective structure is disposed on the flexible data lines 111 to prevent the flexible data lines 111 from being broken.

A matching circuit is disposed between the driver chip 108 and the display screen 11 and is configured to match an impedance of each of data lines 107. Specifically, the impedance can be increased by lengthening lengths of wires of the data lines 107 and decreasing widths of the wires, or the impedance can be decreased by shortening the lengths of the wires of the data lines 107 wires and increasing the width of the wires such that each of the wires of the data lines 107 has the same impedance. Furthermore, in a region with shorter ones of the wires, the data lines 107 are disposed with curved wires and the widths of the wires are decreased. Specifically, wires can be configured to be zigzag wires. In a region with longer ones of the wires, the data lines 107 are disposed with straight wires and the widths of the wires are increased. Of course, there are also other wire configurations, in the embodiment of the present invention no redundant description is made. By changing the wire configuration to match the impedance lowers the cost.

Figure 11:
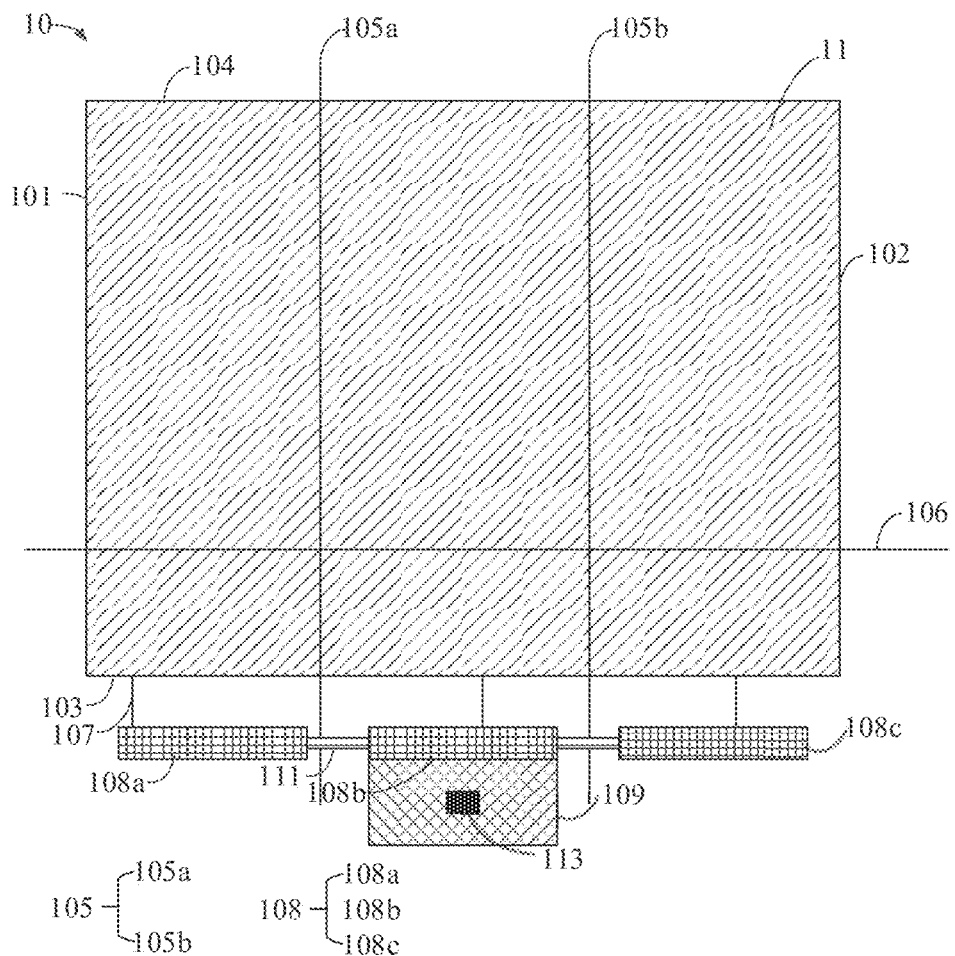
FIG. 11 is an eleventh schematic structural view of the folding display panel of the embodiment of the present invention.

With reference to FIG. 11, a timing control chip 113 is disposed on the rigid circuit board 1092. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

The matching circuit and the timing control chip 113 are disposed in the folding display panel 10 to match the impedance.

Because the first driver chip 108a, the second driver chip 108b, and the third driver chip 108c are disposed on different sides of the extension line of the horizontal folding pivot shaft 105 , the folding display screen 11 prevents folding from affecting the circuit. Furthermore, the matching circuit and the timing control chip 113 disposed to match the impedance can achieve the maximum use rate of power and prevent the folding display panel 10 from generating circuit issues. By changing the wire configuration to match the impedance lowers the cost.

Figure 12:
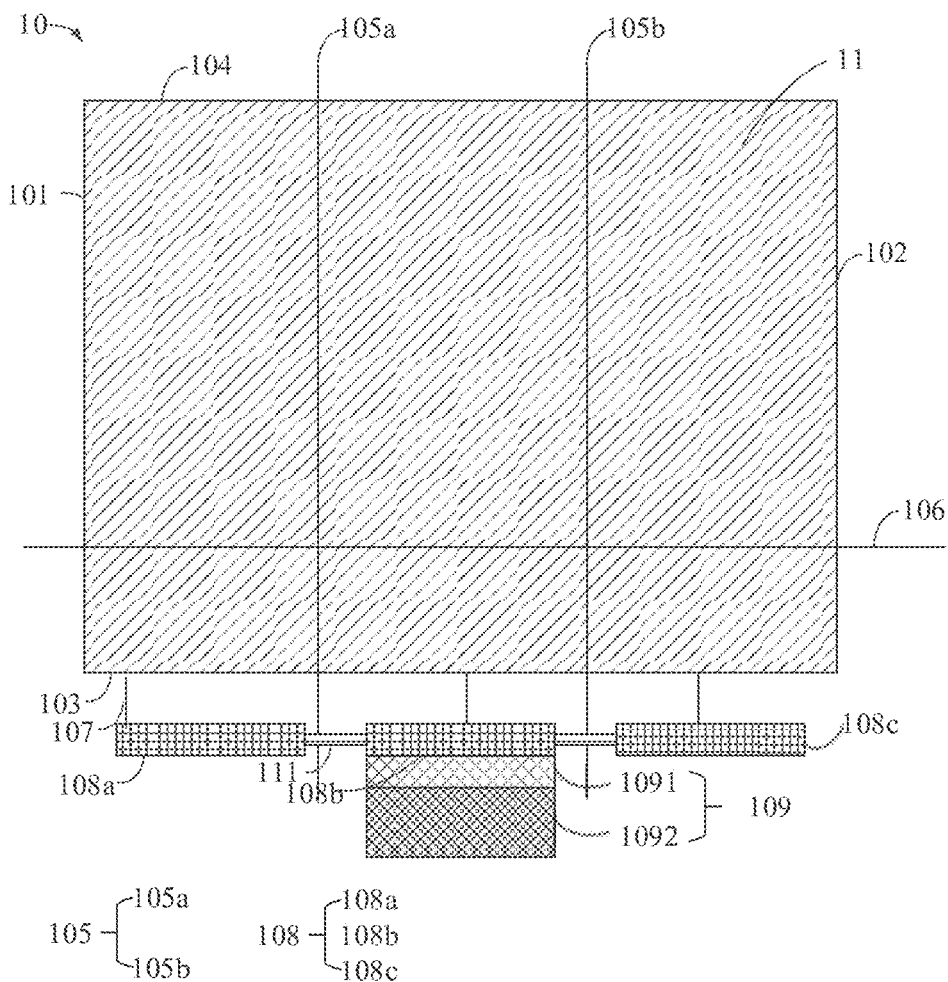
FIG. 12 is a twelfth schematic structural view of the folding display panel of the embodiment of the present invention.

With reference to FIG. 12, the circuit board 109 comprises a flexible circuit board 1091 and a rigid circuit board 1092.

The flexible circuit board 1091 is disposed on the side of the driver chip 108 away from the display screen 11, and the rigid circuit board 1092 is disposed on a side of the flexible circuit board 1091 away from the driver chip 108.

Figure 13:
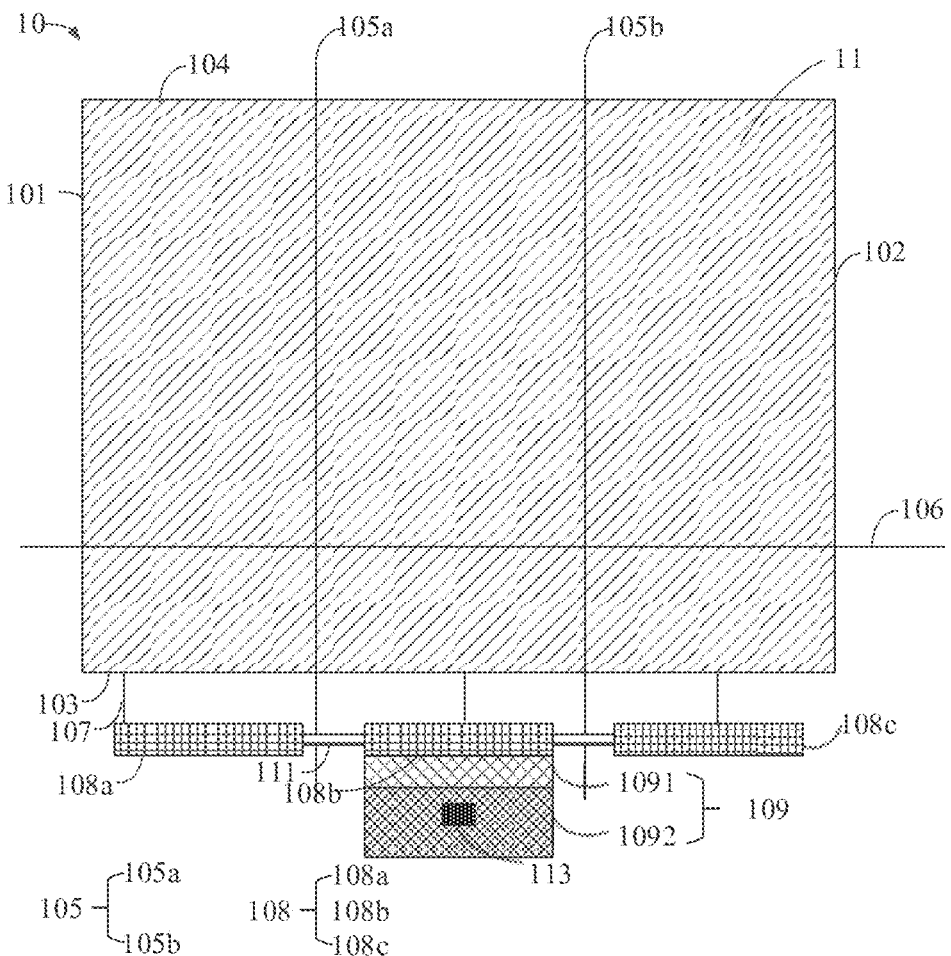
FIG. 13 is a thirteenth schematic structural view of the folding display panel of the embodiment of the present invention.

With reference to FIG. 13, a timing control chip 113 is disposed on the rigid circuit board 1092. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

Figure 14:
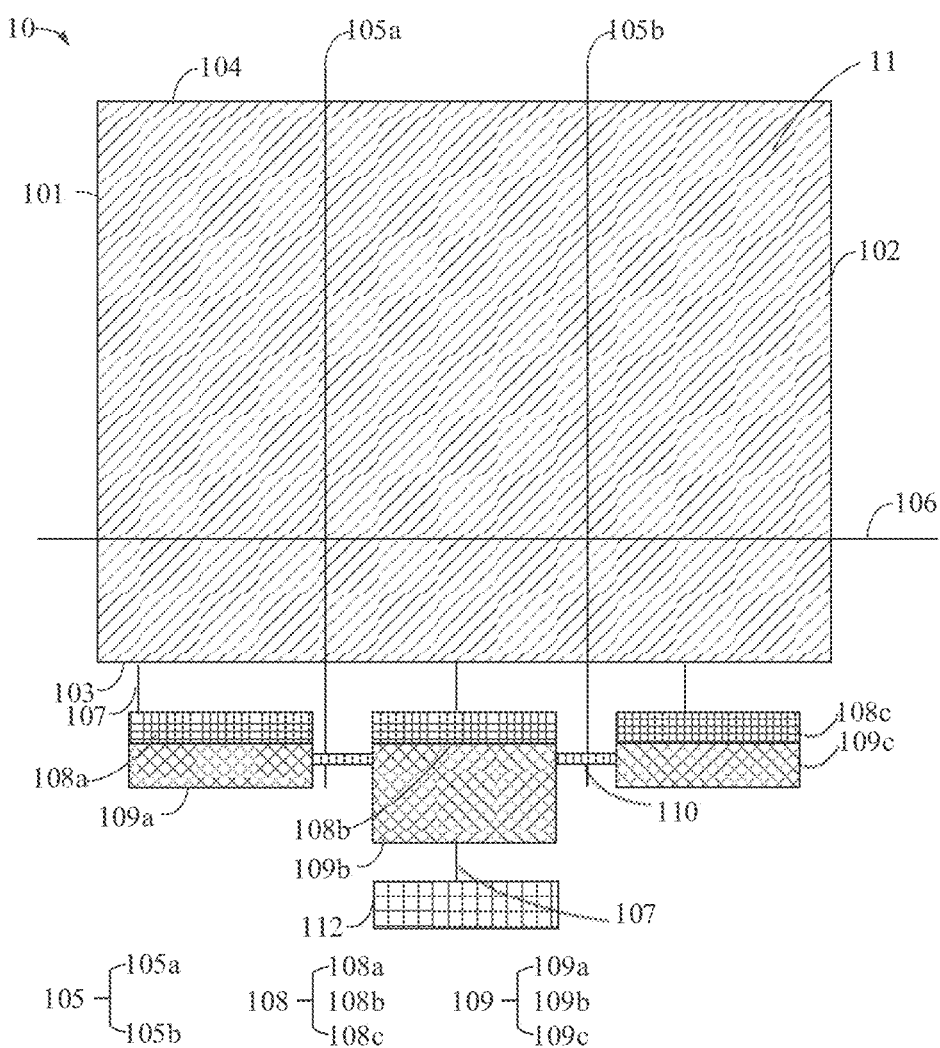
FIG. 14 is a fourteenth schematic structural view of the folding display panel of the embodiment of the present invention.

With reference to FIG. 14, FIG. 14 is a fourteenth schematic structural view of the folding display panel 10 of the embodiment of the present invention.

In the embodiment of the present invention, a difference of the folding display panel 10 from the former embodiment is that the circuit board 109 comprises a first circuit board 109a, a second circuit board 109b, and a third circuit board 109c. The first circuit board 109a is connected to the first driver chip 108a and is located a side away from the third side 103. The second circuit board 109b is connected to the second driver chip 108b and is located on a side away from the third side 103. The third circuit board 109c is connected to the third driver chip 108c and is located on a side away from the third side 103. The first circuit board 109a, the second circuit board 109b, and the third circuit board 109c are connected to one another through an adapter flexible circuit board 110. The second circuit board 109b is also connected to a mainboard 112 through the data lines 107. Because folding resistant characteristics of the flexible circuit board 1091, the folding portion of the circuit is achieved by the flexible circuit board 1091. Data signal output of the timing control chip 113, is transported through the bridging adapter flexible circuit board 110 to the left and right driver chips 108 instead of being through internal wires of the display panel, which is achieved simply and conveniently with a lower cost. Furthermore, connection of cascaded signal among multiple driver chips 108 can also be completed by the flexible circuit board 1091 to save the design of the internal wires of the display panel and simplifies the design to facilitate development of mass production.

A matching circuit is disposed between the driver chip 108 and the display screen 11 and is configured to match an impedance of each of data lines 107. Specifically, the impedance can be increased by lengthening lengths of wires of the data lines 107 and decreasing widths of the wires, or the impedance can be decreased by shortening the lengths of the wires of the data lines 107 wires and increasing the width of the wires such that each of the wires of the data lines 107 has the same impedance for matching the impedance. By changing the wire configuration to match the impedance lowers the cost.

Figure 15:
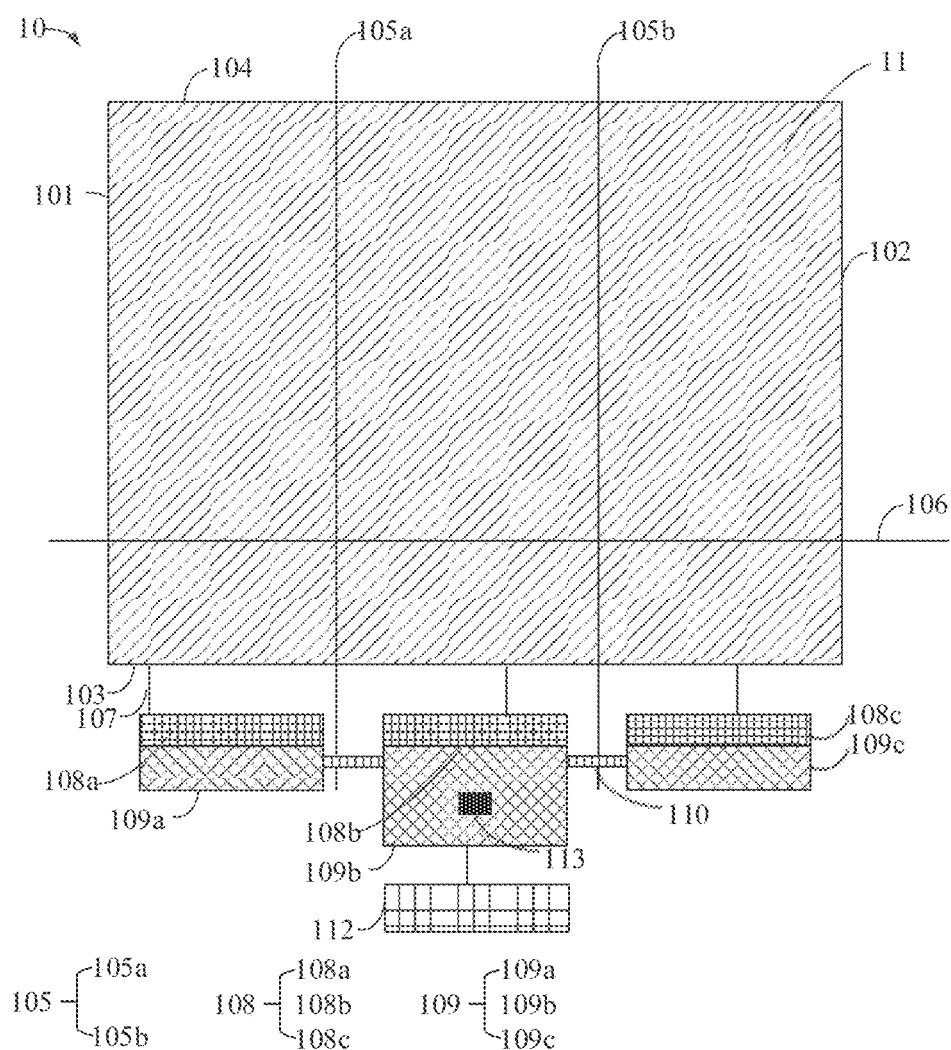
FIG. 15 is a fifteenth schematic structural view of the folding display panel of the embodiment of the present invention.

With reference to FIG. 15, a timing control chip 113 is disposed on the circuit board 109. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

The matching circuit and the timing control chip 113 are disposed in the folding display panel 10 to match the impedance.

Because the first circuit board 109a, the second circuit board 109b, and the third circuit board 109c are disposed on different sides of the extension line of the horizontal folding pivot shaft 105, the folding display screen 11 can prevent folding from affecting the circuit board. Furthermore, the matching circuit and the timing control chip 113 disposed to match the impedance can achieve the maximum use rate of power and prevent the folding display panel 10 from generating circuit issues.

Figure 16:
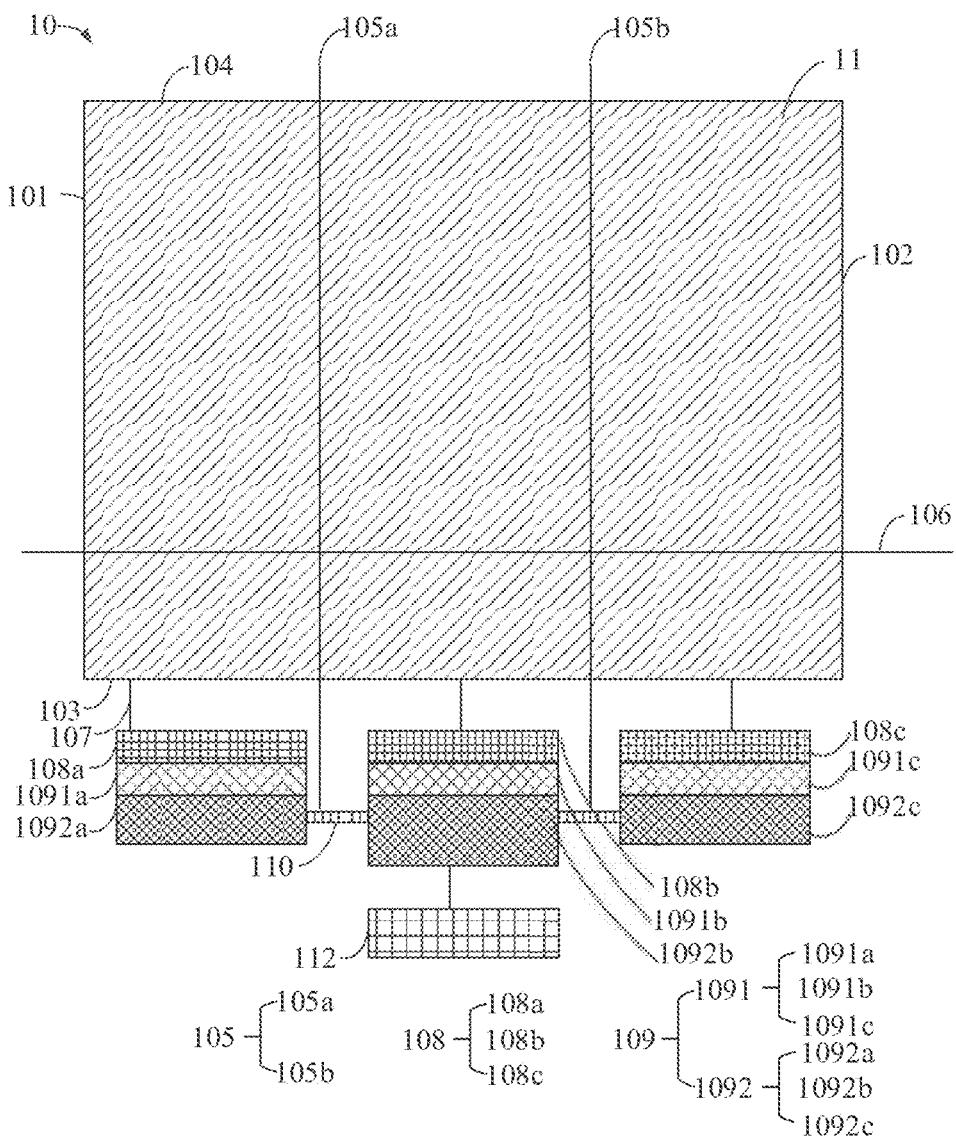
FIG. 16 is a sixteenth schematic structural view of the folding display panel of the embodiment of the present invention.

With reference to FIG. 16, the circuit board 109 comprises a flexible circuit board 1091 and a rigid circuit board 1092. The flexible circuit board 1091 is disposed on a side of the driver chip 108 away from the display screen 11, and the flexible circuit board 1091 comprises a first flexible circuit board 1091a, a second flexible circuit board 1091b, and a third flexible circuit board 1091c. The rigid circuit board 1092 is disposed on a side of the flexible circuit board 1091 away from the driver chip 108, and the rigid circuit board 1092 comprises a first rigid circuit board 1092a, a second rigid circuit board 1092b, and a third rigid circuit board 1092c. The first rigid circuit board 1092a, the second rigid circuit board 1092b, and the third rigid circuit board 1092c are connected to one another through an adapter flexible circuit board 110.

Figure 17:
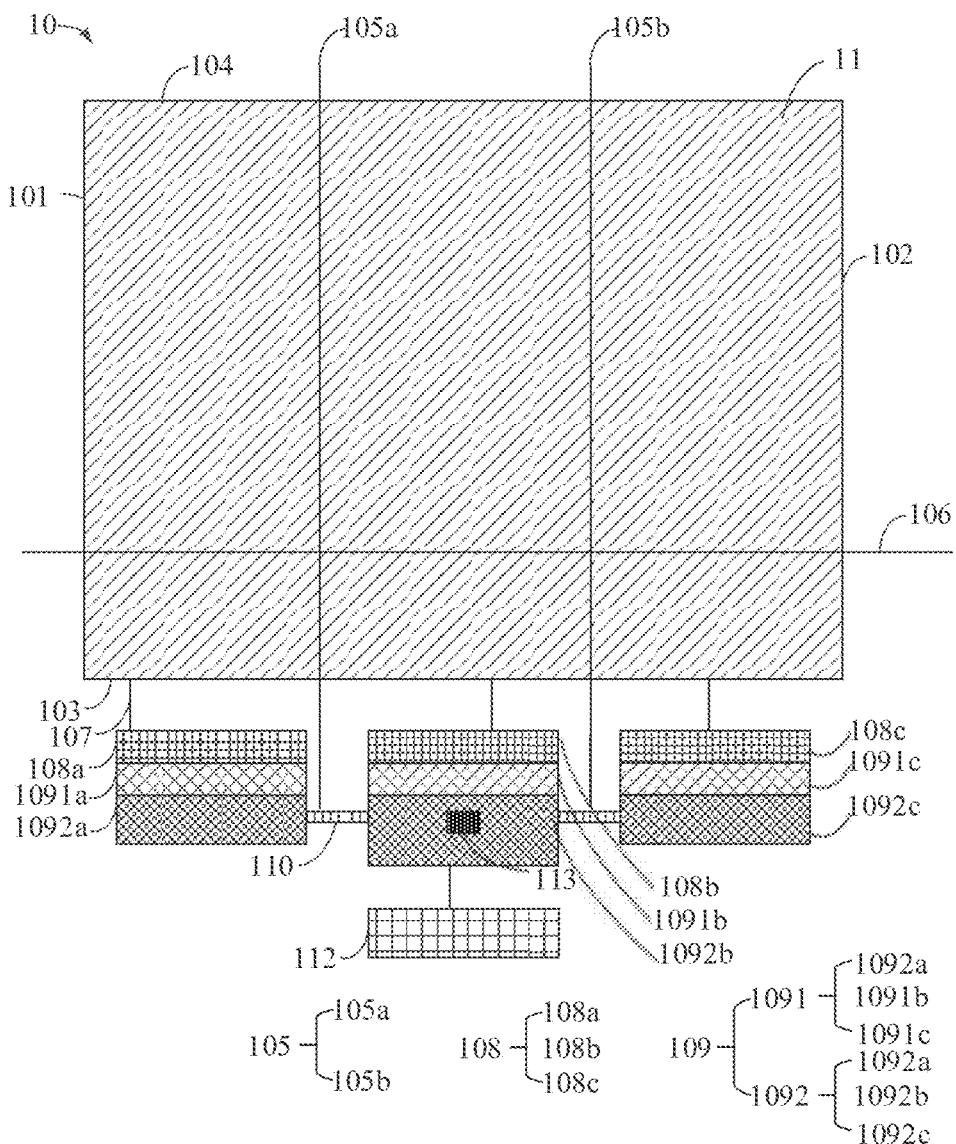
FIG. 17 is a seventeenth schematic structural view of the folding display panel of the embodiment of the present invention.

With reference to FIG. 17, a timing control chip 113 is disposed on the rigid circuit board 1092. The timing control chip 113, by adjusting a delay time of a data signal, matches an impedance of each of the data lines 107. Specifically, wire signals of the data lines 107 are lengthened or shortened by encoding such that data wire signals of the s of different lengths have the same delay time. Utilizing the timing control chip 113 to match the impedance can reduce complexity degree of design of the display panel.

The matching circuit and the timing control chip 113 are disposed in the folding display panel 10 to match the impedance.

Because the first flexible circuit board 1091a, the second flexible circuit board 1091b, and the third flexible circuit board 1091c are disposed on a side of the extension line of the horizontal folding pivot shaft 105 while the first rigid circuit board 1092a, the second rigid circuit board 1092b, and the third rigid circuit board 1092c are disposed on another side of the extension line of the horizontal folding pivot shaft 105, the folding display screen 11 prevents folding from affecting the circuit. Furthermore, the matching circuit and the timing control chip 113 disposed to match the impedance can achieve the maximum use rate of power and prevent the folding display panel 10 from generating circuit issues.

Figure 18:
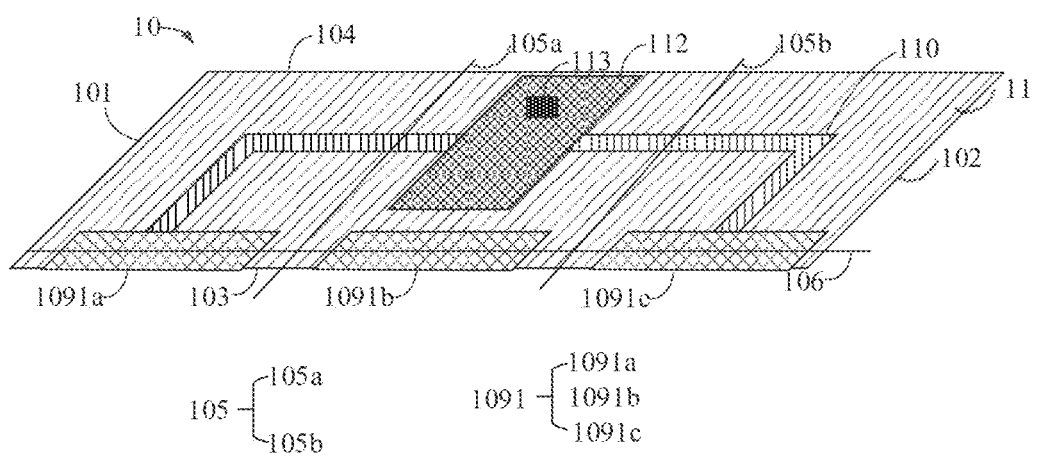
FIG. 18 is an eighteenth schematic structural view of the folding display panel of the embodiment of the present invention.

With reference to FIG. 18, FIG. 18 is an eighteenth schematic structural view of the folding display panel 10 of the embodiment of the present invention.

In the embodiment of the present invention, folding display panel 10 further comprises a timing control chip 113 and a circuit board 109. The circuit board 109 comprises a flexible circuit board 1091, an adapter flexible circuit board 110 and a mainboard 112. The flexible circuit board 1091 comprises a first flexible circuit board 1091a, a second flexible circuit board 1091b, and a third flexible circuit board 1091c. The first flexible circuit board 1091a, the second flexible circuit board 1091b, and the third flexible circuit board are disposed on a vertical folding pivot shaft 106. The horizontal folding pivot shaft 105 comprises a first horizontal folding pivot shaft 105a and a second horizontal folding pivot shaft 105b. The first flexible circuit board 1091a and the second flexible circuit board 1091b are located on two sides of the first horizontal folding pivot shaft 105a respectively. The second flexible circuit board 1091b and the third flexible circuit board 1091c are disposed on two sides of the second horizontal folding pivot shaft 105b respectively. The mainboard 112 is disposed between the first horizontal folding pivot shaft 105a and the second horizontal folding pivot shaft 105b and is connected to the flexible circuit board 1091 through an adapter flexible circuit board 110. The timing control chip 113 is disposed on the mainboard 112. The timing control chip 113, by adjusting a delay time of a data signal, matches an impedance of each of the data lines 107. The flexible circuit board 1091 functions to transfer signals, both the timing control matching the impedance and the data lines 107 matching the impedance can be achieved through the mainboard 112. Folding regions are all on the flexible circuit board 1091. Because of micro folding in a perpendicularly intersecting form, effect to the flexible circuit board 1091 is minor and breaking does not occur easily.

Figure 19:
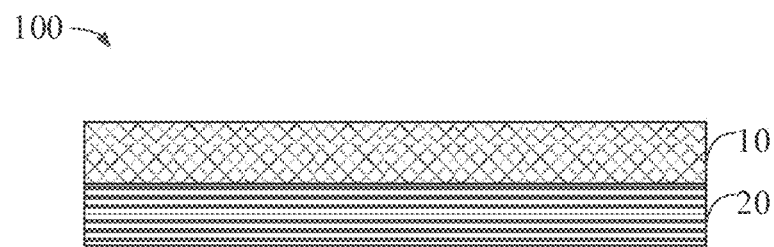
FIG. 19 is a schematic structural view of a display device of the embodiment of the present invention.

An embodiment of the present invention provides a display device 100, FIG. 19 is a schematic structural view of a display device 100 of the embodiment of the present invention. The display device 100 comprises a folding display panel 10, and the folding display panel 10 is the above folding display panel 10. The display device 100 can also comprise an array substrate 20 and other device. The array substrate 20, the other device and assemblies thereof in an embodiment of the present invention are technologies known by a person of ordinary skill in the art and are not described repeatedly herein.

The display device 100 provided by the embodiment of the present invention comprises the above folding display panel 10. The folding display panel 10 comprises a display screen 11, the display screen 11 comprises a first side 101 and a second side 102 that are disposed opposite to each other and a third side 103 and a fourth side 104 that are disposed opposite to each other. The first side 101 and the second side 102 are perpendicular to the third side 103 and the fourth side 104, and are connected to the third side 103 and the fourth side 104. The display screen 11 is capable of folding into at least two horizontal display surfaces along a horizontal folding pivot shaft 105 parallel to the first side 101 and the second side 102, and the display screen 11 is also capable of folding into at least two vertical display surfaces along a vertical folding pivot shaft 106 perpendicular to the first side 101 and the second side 102. the folding display panel 10 changes the single folding configuration, and sets forth configuration and application of the perpendicularly intersecting screen.

The detailed description of the folding display panel and the display device provided by the embodiments of the present invention is given above. Specific examples are used in this article to explain the principle and implementation of the present invention. The above description of the implementation is only for help. At the same time, for a person of ordinary skill in the art, according to the idea of the present invention, there will be changes in the specific implementation and scope of application. In summary, the content of this specification should not be understood as restrictions on the present invention.

What is claimed is:

1. A folding display panel, comprising a display screen, wherein the display screen comprises a first side and a second side that are opposite to each other, and a third side and a fourth side that are opposite to each other, the first side and the second side are perpendicular to the third side and the fourth side, and are connected to the third side and the fourth side, the display screen is capable of folding into at least two horizontal display surfaces along a horizontal folding pivot shaft parallel to the first side and the second side, and the display screen is capable of folding into at least two vertical display surfaces along a vertical folding pivot shaft perpendicular to the first side and the second side, the folding display panel further comprising a driver chip, data lines, and a circuit board, wherein the driver chip is connected to one of the first, second, third, and fourth sides of the display screen through the data lines, and the circuit board is disposed on a side of the driver chip away from the display screen, wherein the driver chip comprises a first driver chip an a second driver chip, the first driver chip and the second driver chip are disposed on two sides of the vertical folding pivot shaft extension line respectively, and are connected to the first side through the data lines respectively; the circuit board comprises a first circuit board and a second circuit board, the first circuit board is connected to the first driver chip and is located on a side away from the first side, the second circuit board is connected to the second driver chip and is located on the side away from the first side, and the first circuit board are connected to the second circuit board through an adapter flexible circuit board.

2. The folding display panel as claimed in claim 1, wherein the driver chip comprises a first driver chip and a second driver chip, the first driver chip and the second driver chip are disposed on a side of the vertical folding pivot shaft extension line and are connected to the first side through the data lines respectively; the circuit board is connected to the first driver chip and the second driver chip and is located on a side away from the first side.

3. The folding display panel as claimed in claim 2, wherein the circuit board comprises a first circuit board and a second circuit board, the first circuit board is connected to the first driver chip and is located on the side away from the first side, the second circuit board is connected to the second driver chip and is located on a side away from the first side, and the first circuit board is connected to the second circuit board through an adapter flexible circuit board.

4. The folding display panel as claimed in claim 1, wherein the horizontal folding pivot shaft comprises a first horizontal folding pivot shaft and a second horizontal folding pivot shaft, the driver chip comprises a first driver chip, a second driver chip , and a third driver chip, the first driver chip, the second driver chip, and the third driver chip are connected to the third side through the data lines respectively, the first driver chip and the second driver chip are located on two sides of the first horizontal folding pivot shaft respectively, the second driver chip and the third driver chip are located on two sides of the second horizontal folding pivot shaft, and the first driver chip, the second driver chip, and the third driver chip are connected to one another through flexible data lines.

5. The folding display panel as claimed in claim 4, wherein the circuit board comprises a first circuit board, a second circuit board, and a third circuit board, the first circuit board is connected to the first driver chip and is located on a side away from the third side, the second circuit board is connected to the second driver chip and is located on the side away from the third side, the third circuit board is connected to the third driver chip and is located on the side away from the third side, the first circuit board, the second circuit board, and the third circuit board are connected to one another through an adapter flexible circuit board, and the second circuit board is connected to a mainboard through the data lines.

6. The folding display panel as claimed in claim 1, wherein a matching circuit is disposed between the driver chip and the display screen, and the matching circuit is configured to match an impedance of each of the data lines.

7. The folding display panel as claimed in claim 1, wherein the circuit board comprises a flexible circuit board and a rigid circuit board, the flexible circuit board is disposed on a side of the driver chip away from the display screen, the rigid circuit board is disposed on a side of the flexible circuit board away from the driver chip, a timing control chip is disposed on the rigid circuit board, and the timing control chip is configured to match an impedance of each of the data lines by adjusting a delay time of a data signal.

8. The folding display panel as claimed in claim 1 further comprising a timing control chip and a circuit board, wherein the circuit board comprises a flexible circuit board, an adapter flexible circuit board, and a mainboard; the flexible circuit board comprises a first flexible circuit board, a second flexible circuit board, and a third flexible circuit board, the first flexible circuit board, the second flexible circuit board, and the third flexible circuit board are disposed on the vertical folding pivot shaft, the horizontal folding pivot shaft comprises a first horizontal folding pivot shaft and a second horizontal folding pivot shaft, the first flexible circuit board and second flexible circuit board are located on two sides of the first horizontal folding pivot shaft respectively, the second flexible circuit board and the third flexible circuit board are disposed on two sides of the second horizontal folding pivot shaft respectively; the mainboard is disposed between the first horizontal folding pivot shaft and the second horizontal folding pivot shaft and is connected to the flexible circuit board through the adapter flexible circuit board; and the timing control chip is disposed on the mainboard.

9. A display device, comprising a folding display panel, wherein the folding display panel comprises a display screen, the display screen comprises a first side and a second side that are opposite to each other, and a third side and a fourth side that are opposite to each other, the first side and the second side are perpendicular to the third side and the fourth side, and are connected to the third side and the fourth side, the display screen is capable of folding into at least two horizontal display surfaces along a horizontal folding pivot shaft parallel to the first side and the second side, and the display screen is capable of folding into at least two vertical display surfaces along a vertical folding pivot shaft perpendicular to the first side and the second side, wherein the folding display panel further comprises a driver chip, data lines, and a circuit board, the driver chip is connected to one of the first, second, third, and fourth sides of the display screen through the data lines, and the circuit board is disposed on a side of the driver chip away from the display screen, and wherein the horizontal folding pivot shaft comprises a first horizontal folding pivot shaft and a second horizontal folding pivot shaft, the driver chip comprises a first driver chip, a second driver chip, and a third driver chip, the first driver chip, the second driver chip, and the third driver chip are connected to the third side through the data lines respectively, the first driver chip and the second driver chip are located on two sides of the first horizontal folding pivot shaft respectively, the second driver chip and the third driver chip are located on two sides of the second horizontal folding pivot shaft, and the first driver chip, the second driver chip, and the third driver chip are connected to one another through flexible data lines.

10. The display device as claimed in claim 9, wherein the driver chip comprises a first driver chip an a second driver chip, the first driver chip and the second driver chip are disposed on two sides of the vertical folding pivot shaft extension line respectively, and are connected to the first side through the data lines respectively; the circuit board comprises a first circuit board and a second circuit board, the first circuit board is connected to the first driver chip and is located on a side away from the first side, the second circuit board is connected to the second driver chip and is located on the side away from the first side, and the first circuit board are connected to the second circuit board through an adapter flexible circuit board.

11. The display device as claimed in claim 9, wherein the driver chip comprises a first driver chip and a second driver chip, the first driver chip and the second driver chip are disposed on a side of the vertical folding pivot shaft extension line and are connected to the first side through the data lines respectively; the circuit board is connected to the first driver chip and the second driver chip and is located on a side away from the first side.

12. The display device as claimed in claim 11, wherein the circuit board comprises a first circuit board and a second circuit board, the first circuit board is connected to the first driver chip and is located on the side away from the first side, the second circuit board is connected to the second driver chip and is located on a side away from the first side, and the first circuit board is connected to the second circuit board through an adapter flexible circuit board.

13. The display device as claimed in claim 9, wherein the circuit board comprises a first circuit board, a second circuit board, and a third circuit board, the first circuit board is connected to the first driver chip and is located on a side away from the third side, the second circuit board is connected to the second driver chip and is located on the side away from the third side, the third circuit board is connected to the third driver chip and is located on the side away from the third side, the first circuit board, the second circuit board, and the third circuit board are connected to one another through an adapter flexible circuit board, and the second circuit board is connected to a mainboard through the data lines.

14. The display device as claimed in claim 9, wherein a matching circuit is disposed between the driver chip and the display screen, and the matching circuit is configured to match an impedance of each of the data lines.

15. The display device as claimed in claim 9, wherein the circuit board comprises a flexible circuit board and a rigid circuit board, the flexible circuit board is disposed on a side of the driver chip away from the display screen, the rigid circuit board is disposed on a side of the flexible circuit board away from the driver chip, a timing control chip is disposed on the rigid circuit board, and the timing control chip is configured to match an impedance of each of the data lines by adjusting a delay time of a data signal.

16. The display device as claimed in claim 9, wherein the folding display panel further comprises a timing control chip and a circuit board; the circuit board comprises a flexible circuit board, an adapter flexible circuit board, and a mainboard; the flexible circuit board comprises a first flexible circuit board, a second flexible circuit board, and a third flexible circuit board, the first flexible circuit board, the second flexible circuit board, and the third flexible circuit board are disposed on the vertical folding pivot shaft, the horizontal folding pivot shaft comprises a first horizontal folding pivot shaft and a second horizontal folding pivot shaft, the first flexible circuit board and second flexible circuit board are located on two sides of the first horizontal folding pivot shaft respectively, the second flexible circuit board and the third flexible circuit board are disposed on two sides of the second horizontal folding pivot shaft respectively; the mainboard is disposed between the first horizontal folding pivot shaft and the second horizontal folding pivot shaft and is connected to the flexible circuit board through the adapter flexible circuit board; and the timing control chip is disposed on the mainboard.

\* \* \* \* \*